United States Patent
Oshima

(10) Patent No.: US 11,810,769 B2
(45) Date of Patent: Nov. 7, 2023

(54) PIPING ASSEMBLY AND SUBSTRATE PROCESSING APPARATUS

(71) Applicant: Tokyo Electron Limited, Tokyo (JP)

(72) Inventor: Kazuki Oshima, Miyagi (JP)

(73) Assignee: TOKYO ELECTRON LIMITED, Tokyo (JP)

(\*) Notice: Subject to any disclaimer, the term of this patent is extended or adjusted under 35 U.S.C. 154(b) by 79 days.

(21) Appl. No.: 17/104,499

(22) Filed: Nov. 25, 2020

(65) Prior Publication Data
US 2021/0166958 A1    Jun. 3, 2021

(30) Foreign Application Priority Data

Nov. 28, 2019  (JP) ................. 2019-215691

(51) Int. Cl.
*H01J 37/32* (2006.01)
*H01L 21/683* (2006.01)
(Continued)

(52) U.S. Cl.
CPC .... *H01J 37/32715* (2013.01); *C23C 16/4586* (2013.01); *H01J 37/32724* (2013.01); *H01L 21/6833* (2013.01); *H01L 21/68792* (2013.01); *C23C 16/466* (2013.01); *H01J 37/3244* (2013.01); *H01J 37/32091* (2013.01); *H01L 21/67069* (2013.01); *H01L 21/67109* (2013.01)

(58) Field of Classification Search
CPC ... H01J 37/32082–321; H01J 37/32137; H01J 37/32174; H01J 37/32357; H01J 37/32431–32449; H01J 37/32458–32522; H01J 37/32715–32724; H01J 37/32944; C23C 16/45536–45544; C23C 16/45557; C23C 16/45559; C23C 16/45561; C23C 16/45563; C23C 16/45578; C23C 16/45585; C23C 16/45587–45591; C23C 16/45597; C23C 16/4586; C23C 16/46–466; C23C 16/505; C23C 16/509; H01L 21/67069; H01L 21/68714; H01L 21/68785–68792; H01L 21/67109; H01L 21/6833
See application file for complete search history.

(56) References Cited

U.S. PATENT DOCUMENTS 5,542,559 A * 8/1996 Kawakami .......... H01J 37/3244
                                                              156/345.47
5,720,818 A * 2/1998 Donde ................ C23C 16/4586
                                                              118/728
(Continued)

*Primary Examiner* — Gordon Baldwin
*Assistant Examiner* — Kurt Sweely
(74) *Attorney, Agent, or Firm* — Nath, Goldberg & Meyer; Jerald L. Meyer; Tanya E. Harkins

(57) ABSTRACT

A substrate processing apparatus includes a conductive enclosure having a gas passage, a conductive member having a gas passage, and a piping assembly including a hollow tube having an inner sidewall, a core block disposed in the hollow tube, the core block having an outer sidewall fitting the inner sidewall of the hollow tube, the core block having a first dielectric constant, and at least one dielectric member disposed in at least one of the hollow tube and the core block, the dielectric member having a second dielectric constant higher than the first dielectric constant.

7 Claims, 11 Drawing Sheets

(51) Int. Cl.
    *C23C 16/458*     (2006.01)
    *H01L 21/687*     (2006.01)
    *H01L 21/67*     (2006.01)
    *C23C 16/46*     (2006.01)

(56) References Cited

U.S. PATENT DOCUMENTS

| | | | | |
|---|---|---|---|---|
| 6,500,299 | B1* | 12/2002 | Mett | C23C 16/455 118/728 |
| 6,581,275 | B2* | 6/2003 | Narendrnath | H01L 21/6831 29/842 |
| 7,622,017 | B2* | 11/2009 | Himori | H01L 21/6831 156/345.43 |
| 7,685,965 | B1* | 3/2010 | Hao | H01J 37/32623 118/723 R |
| 8,503,151 | B2 | 8/2013 | Comendant | |
| 2006/0076108 | A1* | 4/2006 | Holland | H01L 21/6831 118/724 |
| 2009/0086401 | A1* | 4/2009 | Samir | H01L 21/6831 361/234 |
| 2009/0230636 | A1* | 9/2009 | Goto | H01L 21/6831 279/128 |
| 2009/0255631 | A1* | 10/2009 | Sato | H01J 37/3244 156/345.43 |
| 2015/0243541 | A1* | 8/2015 | Hayashi | H01L 21/6875 427/126.3 |
| 2016/0276141 | A1* | 9/2016 | Sun | C04B 41/009 |
| 2016/0276198 | A1* | 9/2016 | Anada | H01L 21/6833 |
| 2017/0352568 | A1* | 12/2017 | Cho | H01L 21/67109 |

\* cited by examiner

PIPING ASSEMBLY AND SUBSTRATE PROCESSING APPARATUS

CROSS-REFERENCE TO RELATED APPLICATION

This application is based upon and claims the benefit of priority from Japanese Patent Application No. 2019-215691, filed on Nov. 28, 2019, the entire contents of which are incorporated herein by reference.

TECHNICAL FIELD

The present disclosure relates to a piping assembly and a substrate processing apparatus.

BACKGROUND

In a substrate processing apparatus that performs a process such as etching on a substrate using plasma, it is important to manage the temperature of the substrate. The substrate is placed on an electrostatic chuck provided on a lower electrode. The temperature of the lower electrode is controlled by a refrigerant flowing inside the lower electrode, and the temperature of the electrostatic chuck is controlled by a heater provided therein. A heat transfer gas such as a helium gas is supplied between the electrostatic chuck and the substrate. The heat of the lower electrode is transferred to the electrostatic chuck, and the heat of the electrostatic chuck is transferred to the substrate via the heat transfer gas. By controlling the pressure of the heat transfer gas, the amount of heat transfer between the electrostatic chuck and the substrate can be controlled, so that temperature of the substrate can be controlled. The heat transfer gas is supplied through a pipe provided between a grounded enclosure and the lower electrode.

By the way, since RF (Radio Frequency) power is supplied to the lower electrode, a potential difference is generated at both ends of the pipe provided between the enclosure and the lower electrode. As a result, in the pipe, electrons emitted from the electrode are accelerated and collide with atoms of the heat transfer gas in the pipe, which may cause discharging (arcing) in the pipe. In order to prevent this, a technique is known in which a passage in the pipe is formed in a spiral shape (see e.g., Patent Document 1 below). As a result, the length of a space within the pipe in an electric field direction can be shortened, so that the acceleration of electrons can be suppressed, which can suppress the occurrence of discharging.

PRIOR ART DOCUMENT

Patent Document

U.S. Pat. No. 8,503,151

SUMMARY

According to one embodiment of the present disclosure, there is provided a substrate processing apparatus including a conductive enclosure having a gas passage and being grounded; a substrate support disposed in the conductive enclosure and including a conductive member having a gas passage; a power source connected to the conductive member; and a piping assembly disposed between the conductive enclosure and the conductive member, and configured to supply a gas from an outside of the conductive enclosure to the gas passage of the conductive member through the gas passage of the conductive enclosure, the piping assembly including: a hollow tube having an inner sidewall; a core block disposed in the hollow tube and having an outer sidewall fitting the inner sidewall of the hollow tube, the core block having a first dielectric constant; and at least one dielectric member disposed in at least one of the hollow tube and the core block, the at least one dielectric member having a second dielectric constant higher than the first dielectric constant, wherein at least one of the inner sidewall of the hollow tube and the outer sidewall of the core block has at least one spiral groove, the at least one spiral groove defines an internal passage having a first opening and a second opening, the first opening is in fluid communication with the gas passage of the conductive member, and the second opening is in fluid communication with the gas passage of the conductive enclosure.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, a piping assembly and a substrate processing apparatus according to an embodiment are described in detail based on the drawings. It should be noted that the following embodiment does not limit the disclosed piping assembly and substrate processing apparatus.

By the way, in substrate processing using plasma in recent years, a voltage supplied to a lower electrode tends to increase. Therefore, an electric discharge of the heat transfer gas is likely to occur in a piping assembly. When the voltage supplied to the lower electrode increases, it is conceivable to narrow the width of a spiral passage in the piping assembly to further shorten the length of a space in the piping assembly in an electric field direction.

However, in a connecting portion between the piping assembly and the lower electrode, there is a portion where the length of the space in the electric field direction becomes longer than the width of the spiral passage. Therefore, the discharge is more likely to occur at the connecting portion between the piping assembly and the lower electrode than at the inside of the piping assembly. In addition, similarly, the discharge is more likely to occur even between the piping assembly and an enclosure than at the inside of the piping assembly.

Therefore, the present disclosure provides a technique capable of suppressing generation of the electric discharge at the connecting portion of the piping assembly.

[Configuration of Substrate Processing Apparatus 1]

Figure 1:
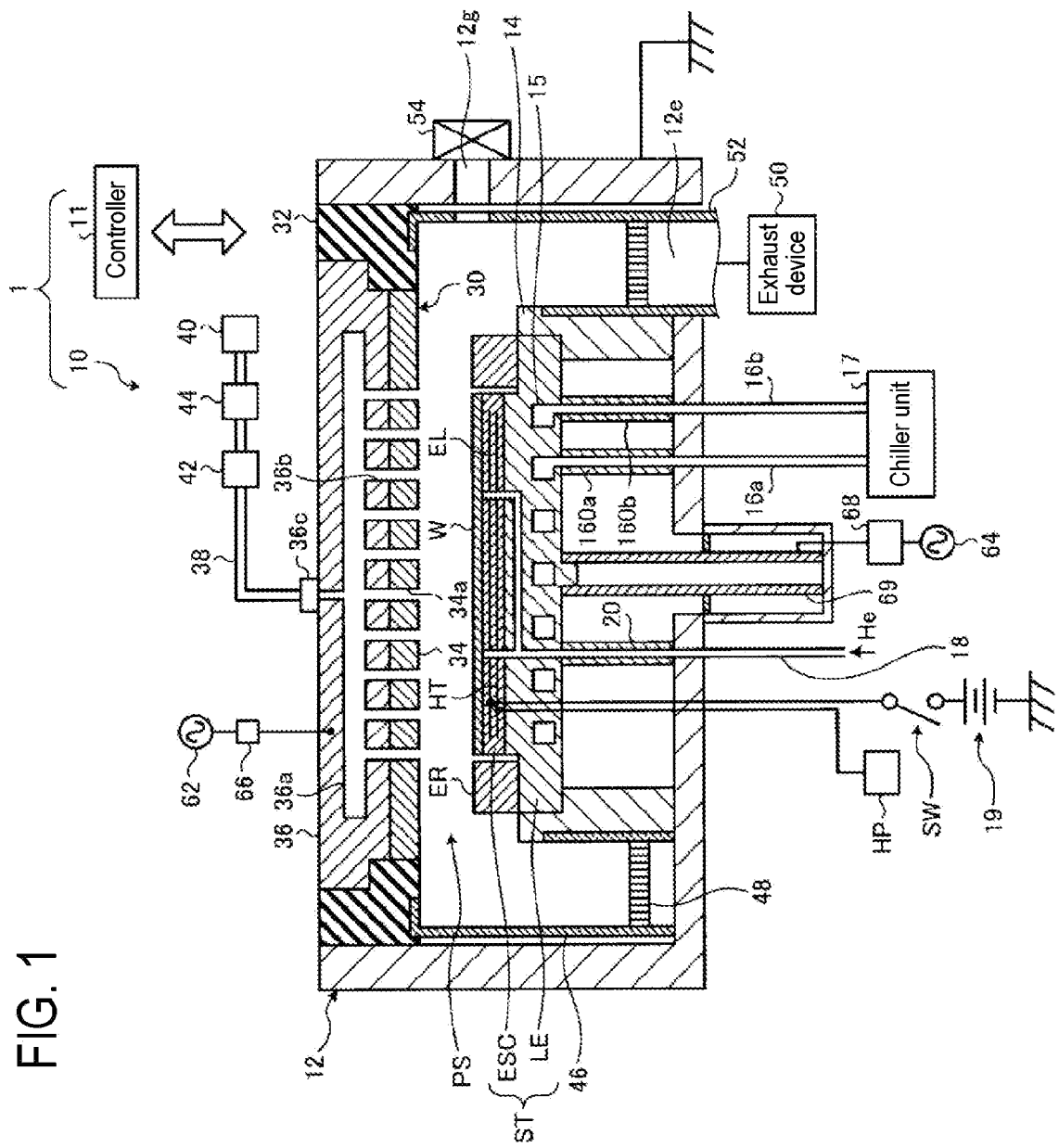
FIG. 1 is a schematic cross-sectional view showing an example of a substrate processing apparatus according to an embodiment of the present disclosure.

FIG. 1 is a schematic cross-sectional view showing an example of a substrate processing apparatus 1 according to an embodiment of the present disclosure. In the present embodiment, the substrate processing apparatus 1 is a plasma etching apparatus that includes parallel flat plate electrodes, for example, and performs etching on a substrate W using capacitively-coupled plasma (CCP). The substrate processing apparatus 1 includes an apparatus body 10 and a controller 11. The apparatus body 10 has a processing container 12 that is made of, for example, a conductive material such as aluminum and has, for example, substantially a hollow cylinder shape. The processing container 12 is an example of a conductive member. An inner wall surface of the processing container 12 is anodized. Further, the processing container 12 is grounded for safety. The processing container 12 is an example of an enclosure.

A substantially cylindrical support 14 made of, for example, an insulating material such as quartz is provided on the bottom of the processing container 12. The support 14 extends from the bottom of the processing container 12 in a vertical direction (for example, in the direction of an upper electrode 30) in the processing container 12.

A stage ST, which is a substrate support, is provided inside the processing container 12. The stage ST is an example of a conductive member. The stage ST is supported by the support 14. The stage ST holds the substrate W on the upper surface of the stage ST. The stage ST has an electrostatic chuck ESC and a lower electrode LE. The lower electrode LE is made of, for example, a conductive material such as aluminum, and has substantially a disc shape. The electrostatic chuck ESC is disposed on the lower electrode LE.

The electrostatic chuck ESC has a structure in which an electrode EL, which is a conductive film, is disposed between a pair of insulating layers or a pair of insulating sheets. A DC power supply 19 is electrically connected to the electrode EL via a switch SW. The electrostatic chuck ESC holds the substrate W on the upper surface of the electrostatic chuck ESC by an electrostatic force such as a Coulomb force generated by a DC voltage supplied from the DC power supply 19. Thereby, the electrostatic chuck ESC can hold and support the substrate W.

A heat transfer gas such as a helium gas is supplied to the electrostatic chuck ESC via a pipe 18 and a piping assembly 20. The heat transfer gas supplied via the pipe 18 and the piping assembly 20 is supplied between the electrostatic chuck ESC and the substrate W. By adjusting a pressure of the heat transfer gas supplied between the electrostatic chuck ESC and the substrate W, the amount of heat transfer between the electrostatic chuck ESC and the substrate W can be adjusted.

In addition, a heater HT, which is a heating element, is provided inside the electrostatic chuck ESC. A heater power source HP is connected to the heater HT. By supplying power from the heater power source HP to the heater HT, the substrate W on the electrostatic chuck ESC can be heated via the electrostatic chuck ESC. The heater HT may be disposed between the electrostatic chuck ESC and the lower electrode LE.

An edge ring ER is disposed around the electrostatic chuck ESC so as to surround the edge of the substrate W and the electrostatic chuck ESC. The edge ring ER is sometimes called a focus ring. The edge ring ER can improve the in-plane uniformity of processing on the substrate W. The edge ring ER is made of, for example, a material such as quartz that is appropriately selected depending on the material of a film to be etched.

A passage 15 through which an insulating fluid such as Galden® flows is formed inside the lower electrode LE. A chiller unit 17 is connected to the passage 15 via a pipe 16a, a pipe 16b, a pipe 160a, and a pipe 160b. The chiller unit 17 controls the temperature of the insulating fluid flowing in the passage 15 of the lower electrode LE. The insulating fluid whose temperature is controlled by the chiller unit 17 is supplied into the passage 15 of the lower electrode LE via the pipe 16a and the pipe 160a. The insulating fluid flowing in the passage 15 is returned to the chiller unit 17 via the pipe 160b and the pipe 16b. The temperature of the substrate W placed on the electrostatic chuck ESC is adjusted by the lower electrode LE and the heater HT.

A power supply tube 69 for supplying RF power to the lower electrode LE is electrically connected to the lower surface of the lower electrode LE. The power supply tube 69 is made of metal. Although not shown in FIG. 1, lifter pins for transferring the substrate W on the electrostatic chuck ESC, a drive mechanism thereof, and the like are disposed in a space between the lower electrode LE and the bottom of the processing container 12.

A first RF power source 64 is connected to the power supply tube 69 via a matching device 68. The first RF power source 64 is a power source that generates RF power for drawing ions into the substrate W, that is, RF bias power, and generates RF bias power of a frequency of 400 [kHz] to 40.68 [MHz], for example, 13.56 [MHz]. The matching device 68 is a circuit for matching the output impedance of the first RF power source 64 and the input impedance on the load (lower electrode LE) side. The RF bias power generated by the first RF power source 64 is supplied to the lower electrode LE via the matching device 68 and the power supply tube 69.

The upper electrode 30 is provided above the stage ST and at a position opposite to the stage ST. The lower electrode LE and the upper electrode 30 are disposed so as to be substantially parallel to each other. Plasma is generated in a space between the upper electrode 30 and the lower electrode LE, and the generated plasma performs plasma processing such as etching on the substrate W held on the upper surface of the electrostatic chuck ESC. The space between the upper electrode 30 and the lower electrode LE is the processing space PS.

The upper electrode 30 is supported on the upper portion of the processing container 12 via an insulating shield member 32 made of, for example, quartz or the like. The upper electrode 30 has an electrode plate 34 and an electrode support 36. The lower surface of the electrode plate 34 faces the processing space PS. A plurality of gas discharge ports 34a is formed in the electrode plate 34. The electrode plate 34 is made of, for example, a material containing silicon.

The electrode support 36 is made of, for example, a conductive material such as aluminum, and supports the electrode plate 34 from above in a detachable manner. The electrode support 36 may have a water cooling structure (not shown). A diffusion chamber 36a is formed inside the electrode support 36. A plurality of gas flow ports 36b communicating with the gas discharge ports 34a of the electrode plate 34 extends downward (toward the stage ST) from the diffusion chamber 36a. A gas introducing hole 36c for introducing a process gas into the diffusion chamber 36a is formed in the electrode support 36, and a pipe 38 is connected to the gas introducing hole 36c.

A gas source group 40 is connected to the pipe 38 via a valve group 42 and a flow rate controller group 44. The gas source group 40 has a plurality of gas sources. The valve group 42 includes a plurality of valves, and the flow rate controller group 44 includes a plurality of flow rate controllers such as mass flow controllers. Each of the gas sources in the gas source group 40 is connected to the pipe 38 via a corresponding one in the valve group 42 and a corresponding one in the flow rate controller group 44.

As a result, the apparatus body 10 supplies a gas, which is supplied from one or more gas sources selected from the gas source group 40, into the diffusion chamber 36a in the electrode support 36 at an individually adjusted flow rate. The gas supplied into the diffusion chamber 36a diffuses in the diffusion chamber 36a and is supplied in a shower shape into the processing space PS via the individual gas flow ports 36b and the individual gas discharge ports 34a.

A second RF power supply 62 is connected to the electrode support 36 via a matching device 66. The second RF power supply 62 is a power supply that generates RF power for plasma generation, and generates RF power having a frequency of 27 [MHz] to 100 [MHz], for example, 60 [MHz]. The matching device 66 is a circuit for matching the output impedance of the second RF power supply 62 and the input impedance of the load (upper electrode 30) side. The RF power generated by the second RF power supply 62 is supplied to the upper electrode 30 via the matching device 66. Further, the second RF power supply 62 may be connected to the lower electrode LE via the matching device 66.

A deposition shield 46, which is made of aluminum or the like and whose surface is coated with $Y_2O_3$, quartz, or the like, is detachably provided on the inner wall surface of the processing container 12 and the outer surface of the support 14. The deposition shield 46 can prevent etching by-products (depositions) from adhering to the processing container 12 and the support 14.

An exhaust plate 48, which is made of aluminum or the like and has a surface coated with $Y_2O_3$ or quartz, is provided between the outer sidewall of the support 14 and the inner sidewall of the processing container 12 on the bottom side of the processing container 12 (the side where the support 14 is provided). An exhaust port 12e is provided below the exhaust plate 48. An exhaust device 50 is connected to the exhaust port 12e via an exhaust pipe 52.

The exhaust device 50 has a vacuum pump such as a turbo molecular pump, and can reduce an internal pressure of the processing container 12 to a desired degree of vacuum. An opening 12g for loading and unloading the substrate W is formed on the sidewall of the processing container 12 and can be opened and closed by a gate valve 54.

The controller 11 has a processor, a memory, and an input/output interface. The memory stores programs executed by the processor, and recipes including conditions for each process. The processor executes the programs read from the memory and controls each part of the apparatus body 10 through the input/output interface based on the recipes stored in the memory to execute a predetermined process such as etching.

[Details of Piping Assembly 20]

Figure 2:
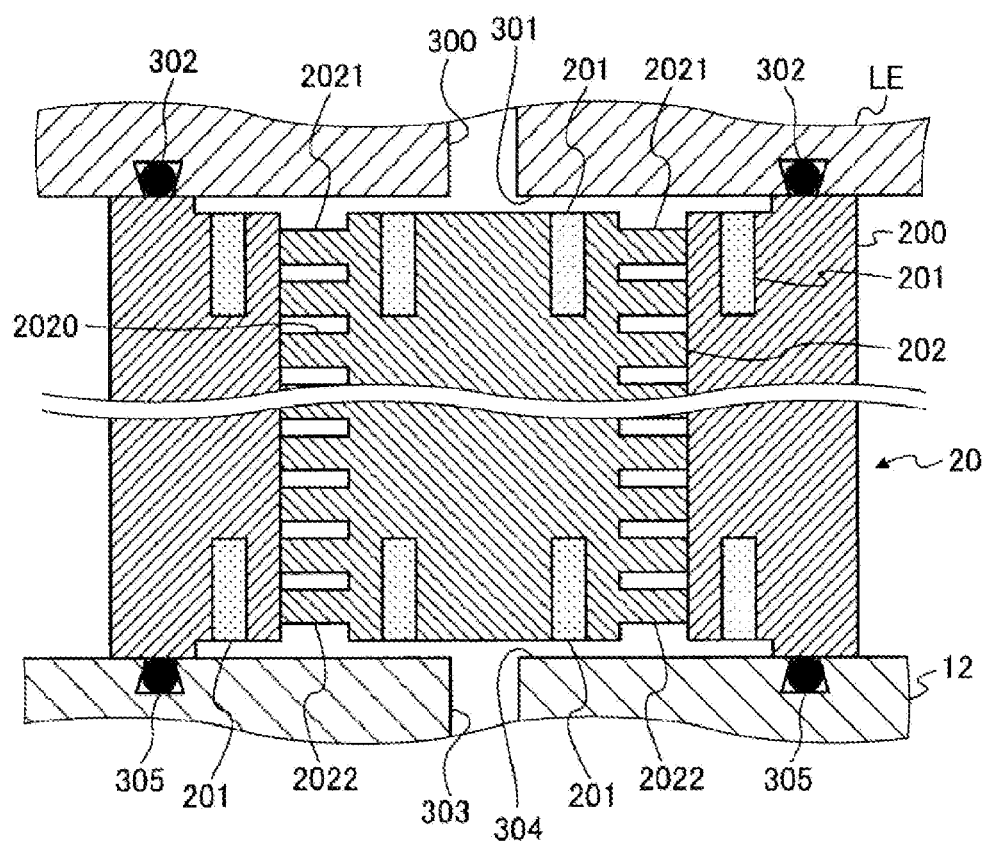
FIG. 2 is an enlarged cross-sectional view showing an example of a connecting portion between a lower electrode and a piping assembly and a connecting portion between the piping assembly and a bottom portion of a processing container.

FIG. 2 is an enlarged cross-sectional view showing an example of a connecting portion between the lower electrode LE and the piping assembly 20 and a connecting portion between the piping assembly 20 and the bottom of the processing container 12. The piping assembly 20 is disposed between the lower electrode LE and the bottom of the processing container 12 and allows the heat transfer gas supplied from the outside of the processing container 12 to flow to the lower electrode LE. A space 301 at the connecting portion between the lower electrode LE and the piping assembly 20 is sealed by a sealing member 302 such as an O-ring. The space 301 is in communication with a passage 300 formed in the lower electrode LE. A space 304 at the connecting portion between the bottom of the processing container 12 and the piping assembly 20 is sealed by a sealing member 305 such as an O-ring. The space 304 is in communication with a passage 303 formed at the bottom of the processing container 12.

The piping assembly 20 has a hollow tube 200, a high dielectric constant member 201, and a core block 202. The high dielectric constant member 201 is made of a material having a higher dielectric constant than the hollow tube 200 and the core block 202. In the present embodiment, the hollow tube 200 and the core block 202 are made of, for example, resin, and the high dielectric constant member 201 is made of, for example, a material containing at least one of quartz, ceramics, silicon, and metals.

The core block 202 is accommodated in the hollow tube 200, and the outer shape of the outer sidewall of the core block 202 has a shape fitting the inner sidewall of the hollow tube 200. In the present embodiment, the outer shape of the core block 202 is substantially a cylinder shape, and the inner sidewall of the hollow tube 200 is substantially a hollow cylinder shape. Note that the outer sidewall of the core block 202 and the inner sidewall of the hollow tube 200 may have a prismatic shape and a rectangular cylindrical shape as long as they have corresponding shapes.

In the present embodiment, a spiral groove 2020 is formed on the outer sidewall of the core block 202 along the outer sidewall of the core block 202. In a state where the core block 202 is accommodated in the hollow tube 200, a space formed by the groove 2020 and the inner sidewall of the hollow tube 200 forms a passage through which the heat transfer gas flows. Since the outer shape of the outer sidewall of the core block 202 is substantially a cylinder shape and the inner sidewall of the hollow tube 200 is substantially a hollow cylinder shape, even when the width of the groove 2020 is narrowed, it is possible to suppress a decrease in conductance of the passage formed by the groove 2020 and the inner sidewall of the hollow tube 200. In addition, the spiral groove 2020 may be formed on the inner sidewall of the hollow tube 200, or may be formed on both the outer sidewall of the core block 202 and the inner sidewall of the hollow tube 200.

An opening 2021 and an opening 2022 communicating with the groove 2020 are provided at both ends of the core block 202. The opening 2021 communicates with the passage 300 of the lower electrode LE via the space 301. The opening 2022 communicates with the passage 303 at the bottom of the processing container 12 via the space 304. Further, the opening 2021 and the opening 2022 may be provided in the hollow tube 200.

Figure 3:
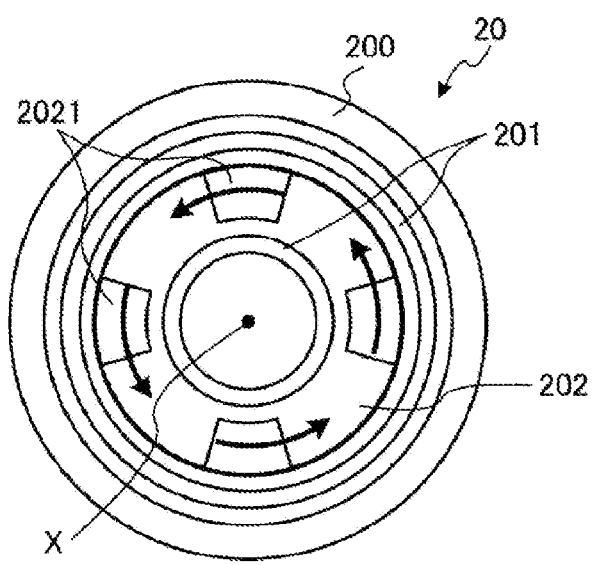
FIG. 3 is a top view showing an example of the piping assembly.
Figure 4:
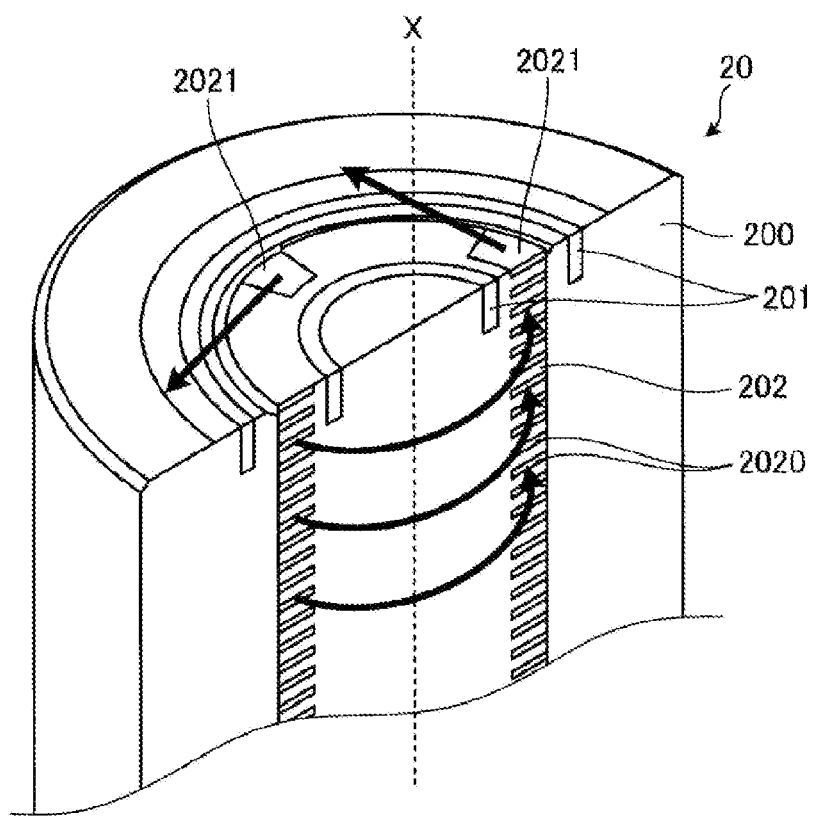
FIG. 4 is a perspective cross-sectional view showing an example of the piping assembly.

FIG. 3 is a top view showing an example of the piping assembly 20. FIG. 4 is a perspective cross-sectional view showing an example of the piping assembly 20. The heat transfer gas supplied from the passage 303 at the bottom of the processing container 12 via the opening 2022 flows, for example, into a spiral passage formed by the groove 2020 provided on the outer sidewall of the core block 202 and the inner sidewall of the hollow tube 200, as shown in FIG. 4. Then, the heat transfer gas flowing in the spiral passage flows into the passage 300 of the lower electrode LE via the opening 2021 and the space 301.

The high dielectric constant member 201 is provided at the end of the hollow tube 200 and in the vicinity of the opening 2021 and the opening 2022. Further, the high dielectric constant member 201 is also provided at the end of the core block 202 and in the vicinity of the opening 2021 and the opening 2022. In the present embodiment, the high dielectric constant member 201 is annularly disposed at the end of the hollow tube 200 along the outer sidewall of the core block 202 so as to surround the opening 2021. Further, in the present embodiment, the high dielectric constant member 201 is annularly disposed on the side closer to an axis X (a spiral axis formed by the groove 2020) of the core block 202 than the opening 2021 along the outer sidewall of the core block 202 so as to surround the axis X. In the present embodiment, the high dielectric constant member 201 has, for example, substantially a hollow cylinder shape as shown in FIGS. 3 and 4.

Here, RF power is supplied from the first RF power source 64 to the lower electrode LE, and the processing container 12 is grounded. Therefore, a potential difference is generated between the lower electrode LE and the processing container 12. If the passage of the heat transfer gas in the piping assembly 20 is linear between the bottom of the processing container 12 and the lower electrode LE, a potential difference across the piping assembly 20 causes electrons emitted from the lower electrode LE or the bottom of the processing container 12 to be accelerated in the piping assembly 20. When the potential difference between the lower electrode LE and the processing container 12 becomes large, the electrons accelerated in the piping assembly 20 collide with atoms of the heat transfer gas in the piping assembly 20, thereby generating discharge (arcing).

In order to prevent the discharge in the piping assembly 20, it is necessary to shorten the length of the passage in the electric field direction. For example, by making the passage of the heat transfer gas in the piping assembly 20 spiral, it is possible to suppress the discharge of the heat transfer gas in the piping assembly 20.

However, with the recent increase in voltage of a process, the situation is such that the heat transfer gas is likely to be discharged easily in the piping assembly 20. In particular, in the connecting portion between the piping assembly 20 and the lower electrode LE and the connecting portion between the piping assembly 20 and the bottom of the processing container 12, since the length of the space in the electric field direction becomes longer than the width of the spiral passage, the situation is such that the discharge is likely to occur easily at the connecting portions.

Figure 5:
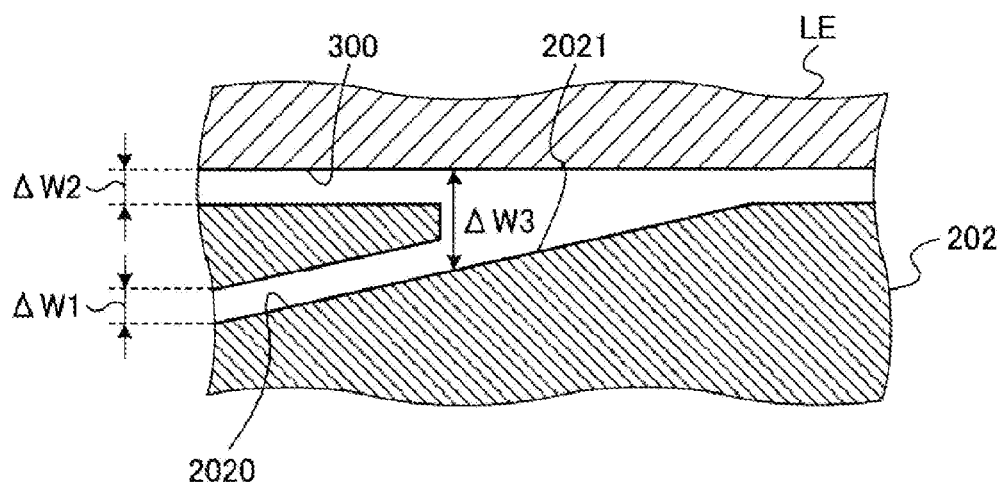
FIG. 5 is an enlarged cross-sectional view showing an example of a connecting portion between the lower electrode and the piping assembly.

FIG. 5 is an enlarged cross-sectional view showing an example of the connecting portion between the lower electrode LE and the piping assembly 20. Although the connection portion between the piping assembly 20 and the lower electrode LE will be described below, the same applies to the connection portion between the piping assembly 20 and the bottom of the processing container 12.

The width ΔW3 of the opening 2021, which is the outlet of the passage formed by the spiral groove 2020, is wider than the width ΔW1 of the spiral groove 2020 and the width ΔW2 of the space 301 of the connecting portion between the lower electrode LE and the piping assembly 20, as shown, for example, in FIG. 5. Therefore, the discharge is more likely to occur in the opening 2021 than in the groove 2020 and the space 301. In order to prevent this, in the present embodiment, as shown, for example, in FIGS. 2 to 4, a high dielectric constant member 201 formed of a material having a higher dielectric constant than the hollow tube 200 and the core block 202 is disposed in the vicinity of the opening 2021.

Figure 6:
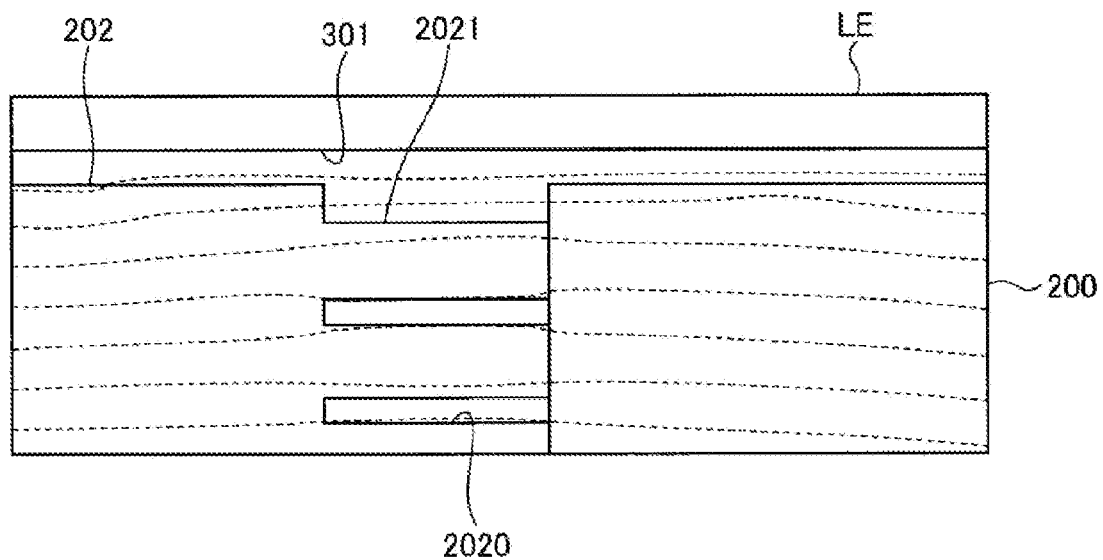
FIG. 6 is a view showing an example of a simulation result of a distribution of equipotential lines in the vicinity of an opening in a comparative example.
Figure 7:
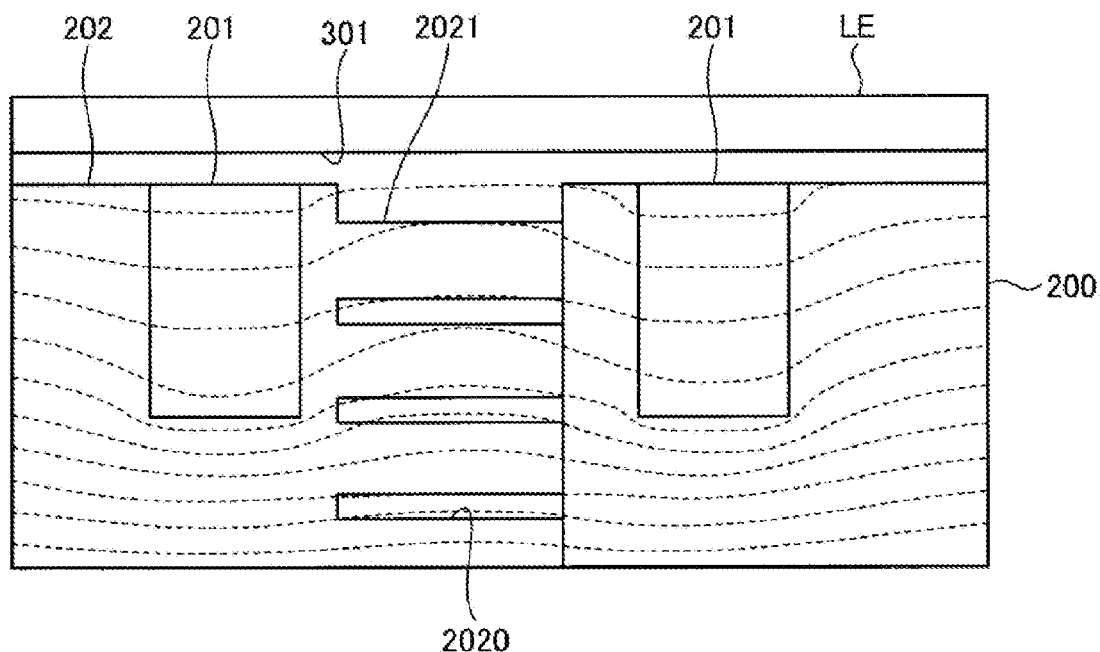
FIG. 7 is a view showing an example of a simulation result of a distribution of equipotential lines in the vicinity of an opening according to the present embodiment.

Here, a distribution of equipotential lines in the vicinity of the opening 2021 is calculated by simulation. FIG. 6 is a view showing an example of a simulation result of a distribution of equipotential lines in the vicinity of the opening 2021 in a comparative example. FIG. 7 is a view showing an example of a simulation result of a distribution of equipotential lines in the vicinity of the opening 2021 in the present embodiment. In case of the comparative example in which the high dielectric constant member 201 is not disposed in the vicinity of the opening 2021, the density of equipotential lines in the vicinity of the opening 2021 is high, as indicated, for example, by a broken line in FIG. 6. Therefore, the discharge is likely to occur in the vicinity of the opening 2021.

In contrast, in the present embodiment, since the high dielectric constant member 201 is disposed in the vicinity of the opening 2021, the density of equipotential lines in the vicinity of the opening 2021 is low, as indicated, for example, by a broken line in FIG. 7. As a result, the discharge in the vicinity of the opening 2021 can be suppressed.

Similarly, in the connecting portion between the piping assembly 20 and the bottom of the processing container 12, since the high dielectric constant member 201 is disposed in the vicinity of the opening 2022, the density of equipotential lines in the vicinity of the opening 2022 is low, and as a result, the discharge in the vicinity of the opening 2022 can be suppressed.

Figure 8:
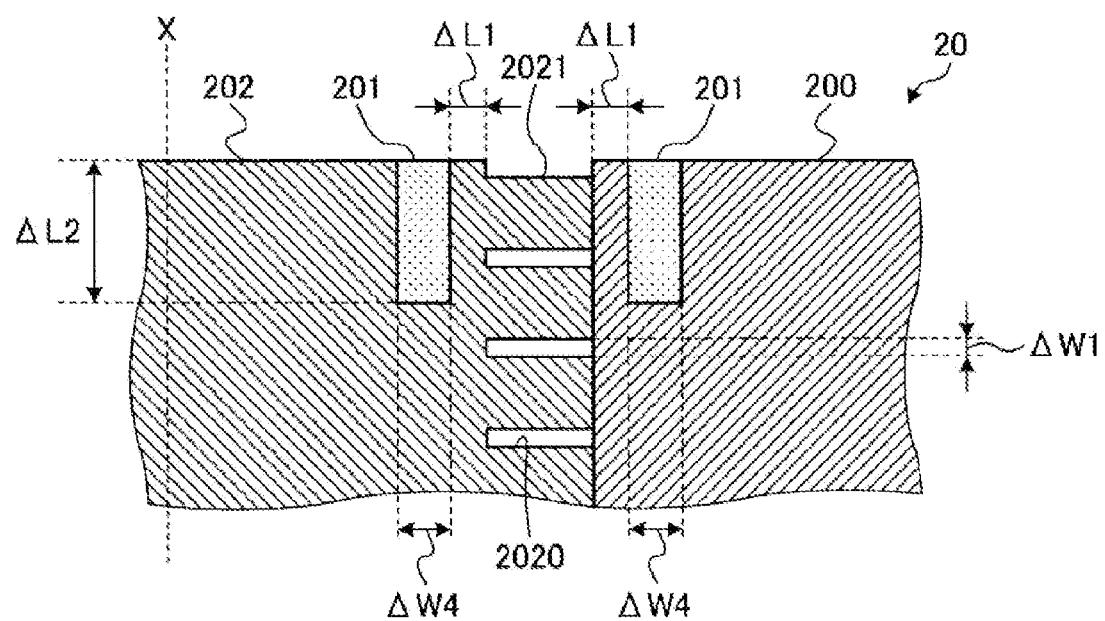
FIG. 8 is a cross-sectional view showing an example of the arrangement of a high dielectric constant member.

In addition, the high dielectric constant member 201 is disposed, for example, at a position shown in FIG. 8 with respect to the opening 2021. FIG. 8 is a cross-sectional view showing an example of the arrangement of the high dielectric constant member 201. The high dielectric constant member 201 is disposed at a position at a distance ΔL1 from the opening 2021. In the present embodiment, the distance ΔL1 may be, for example, within twice the width ΔW1 of the groove 2020. The length ΔL2 of the high dielectric constant member 201 in a direction along the axis X of the piping assembly 20 may be, for example, 12 times or more the width ΔW1 of the groove 2020. In addition, the width ΔW4 of the high dielectric constant member 201 may be, for example, three times or more the width ΔW1 of the groove 2020.

In addition, the smaller the distance ΔL1 is, the shorter the length ΔL2 may be, and the larger the distance ΔL1 is, the longer the length ΔL2 may be.

The embodiment has been described above. As described above, the piping assembly 20 according to the present embodiment is a piping assembly 20 that is disposed between the lower electrode LE and the bottom of the processing container 12 with a potential difference therebetween and flows a gas from the bottom of the processing container 12 to the lower electrode LE, and includes the hollow tube 200, the high dielectric constant member 201, and the core block 202. The core block 202 is disposed in the hollow tube 200 and has an outer sidewall having a shape corresponding to the inner sidewall of the hollow tube 200. The high dielectric constant member 201 has a higher dielectric constant than the hollow tube 200 and the core block 202. The spiral groove 2020 is formed on at least one of the inner sidewall of the hollow tube 200 and the outer sidewall of the core block 202. The spiral groove 2020 forms the gas passage in a state in which the core block 202 is accommodated in the hollow tube 200. The high dielectric constant member 201 is disposed at one or both of the end of the hollow tube 200 and the end of the core block 202. As a result, it is possible to suppress the occurrence of discharge in the connecting portions of the piping assembly 20.

In addition, in the above embodiment, the inner sidewall of the hollow tube 200 has a hollow cylinder shape, and the outer shape of the outer sidewall of the core block 202 is a cylinder shape. As a result, it is possible to suppress a decrease in conductance of the passage formed by the groove 2020 and the inner sidewall of the hollow tube 200.

In addition, in the above embodiment, the high dielectric constant member 201 is annularly disposed at the end of the hollow tube 200 along the outer sidewall of the core block 202. As a result, it is possible to suppress the occurrence of discharge in the connecting portions of the piping assembly 20.

In addition, in the above embodiment, the high dielectric constant member 201 is annularly disposed along the outer sidewall of the core block 202 so as to surround the axis of the core block 202. As a result, it is possible to suppress the occurrence of discharge in the connecting portions of the piping assembly 20.

In addition, in the above embodiment, the distance ΔL1 between the groove 2020 and the high dielectric constant member 201 is within twice the width ΔW1 of the groove 2020. Further, the length ΔL2 of the high dielectric constant member 201 in the direction along the axis X is 12 times or more the width ΔW1 of the groove 2020. As a result, it is possible to suppress the occurrence of discharge in the connecting portions of the piping assembly 20.

Additionally, in the above embodiment, the hollow tube 200 and the core block 202 are made of, for example, resin, and the high dielectric constant member 201 is made of, for example, a material containing at least one of quartz, ceramics, silicon, and metals. As a result, it is possible to suppress the occurrence of discharge in the connecting portions of the piping assembly 20.

Further, the substrate processing apparatus 1 in the above embodiment includes the processing container 12 which is grounded, the stage ST which is provided in the processing container 12 and applied with a predetermined voltage is applied and on which the substrate W is placed, and the piping assembly 20 which is provided between the processing container 12 and the stage ST and supplies a gas from the outside of the processing container 12 to the stage ST via the processing container 12. The piping assembly 20 includes the hollow tube 200, the high dielectric constant member 201, and the core block 202. The core block 202 is disposed in the hollow tube 200 and has an outer sidewall having a shape corresponding to the inner sidewall of the hollow tube 200. The high dielectric constant member 201 has a higher dielectric constant than the hollow tube 200 and the core block 202. The spiral groove 2020 is formed on at least one of the inner sidewall of the hollow tube 200 and the outer sidewall of the core block 202. The spiral groove 2020 forms a gas passage in a state where the core block 202 is accommodated in the hollow tube 200. The high dielectric constant member 201 is disposed at one or both of the end of the hollow tube 200 and the end of the core block 202. As a result, it is possible to suppress the occurrence of discharge in the connecting portions of the piping assembly 20.

[Others]

The technique disclosed in the present disclosure is not limited to the above embodiment, but various modifications can be made within the scope of the disclosure.

Figure 9:
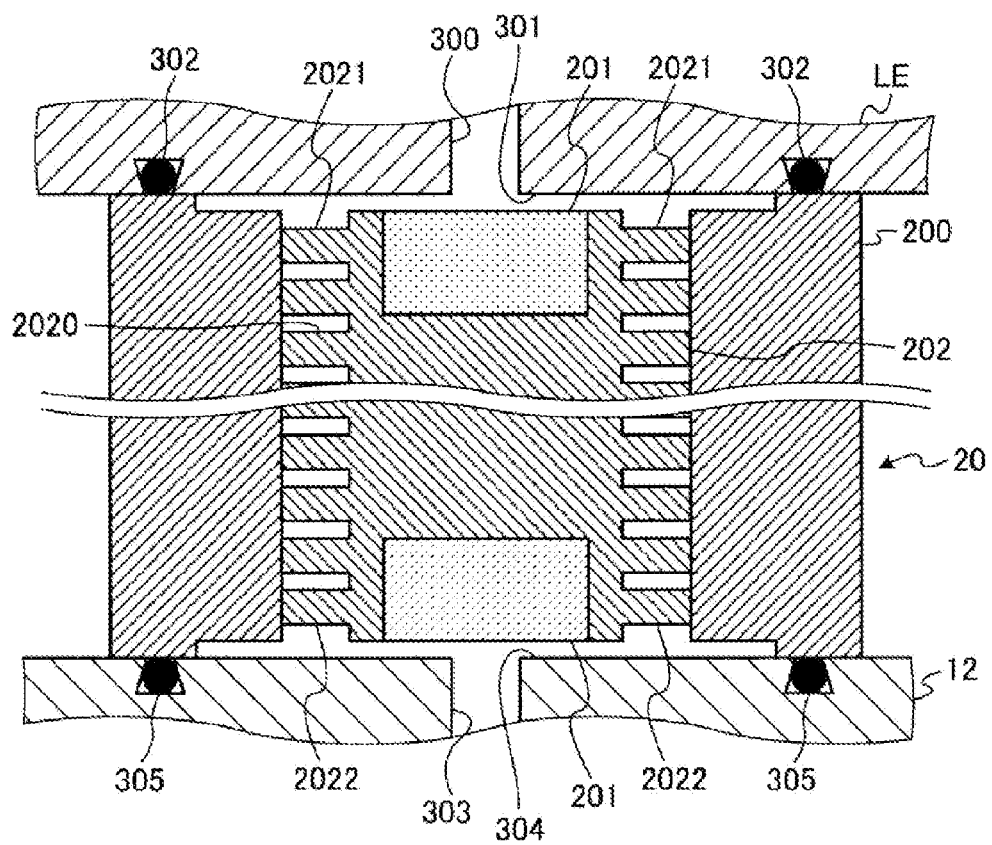
FIG. 9 is a cross-sectional view showing another example of the arrangement of the high dielectric constant member.

For example, in the above embodiment, the high dielectric constant member 201 is provided at both the end of the hollow tube 200 and the end of the core block 202, but the disclosed technique is not limited thereto. For example, the high dielectric constant member 201 may be provided at only one of the end of the hollow tube 200 and the end of the core block 202. When provided at the end of the core block 202, the high dielectric constant member 201 may be formed in substantially a cylinder shape, as shown, for example, in FIG. 9. FIG. 9 is a cross-sectional view showing another example of the arrangement of the high dielectric constant members 201.

Figure 10:
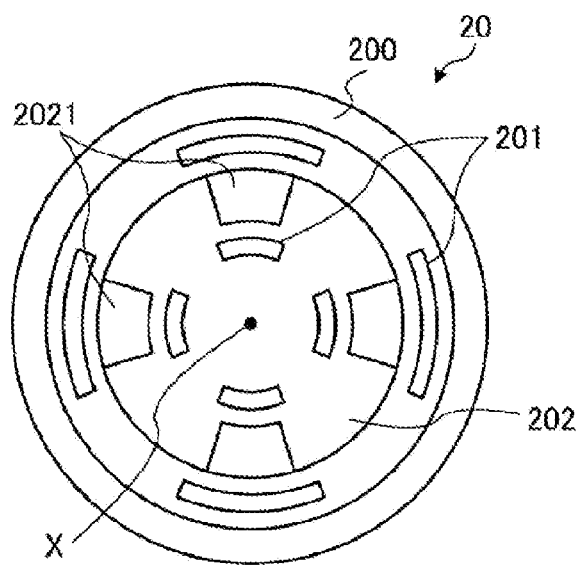
FIG. 10 is a top view showing another example of the arrangement of the high dielectric constant member.

In addition, in the above embodiment, the shape of the high dielectric constant member 201 is a hollow cylinder shape (see FIG. 4), but the disclosed technique is not limited thereto. If the high dielectric constant member 201 is annularly disposed at the end of the hollow tube 200 along the outer sidewall of the core block 202 so as to surround the opening 2021, it may be divided into a plurality of high dielectric constant members 201, as shown, for example, in FIG. 10. In addition, if the high dielectric constant member 201 is annularly disposed on the core block 202 on the axis X side from the opening 2021 along the outer sidewall of the core block 202 so as to surround the axis X, it may be divided into a plurality of high dielectric constant members 201, as shown, for example, in FIG. 10. FIG. 10 is a top view showing another example of the arrangement of the high dielectric constant members 201.

Figure 11:
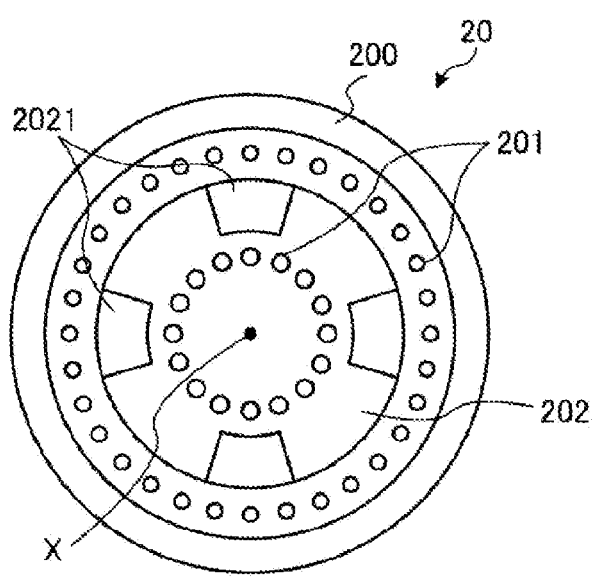
FIG. 11 is a top view showing another example of the arrangement of the high dielectric constant member.

In addition, as shown, for example, in FIG. 11, a plurality of high dielectric constant members 201 may be disposed along the outer sidewall of the core block 202 at the end of the hollow tube 200 so as to surround the opening 2021, and may be annularly disposed on the core block 202 on the axis X side of the opening 2021 so as to surround the axis X. FIG. 11 is a top view showing another example of the arrangement of the high dielectric constant member 201. In the example of FIG. 11, each high dielectric constant member 201 is formed in a rod shape and is disposed at the ends of the hollow tube 200 and the core block 202 so that the longitudinal direction of each high dielectric constant member 201 is oriented along the direction of the axis X.

Figure 12:
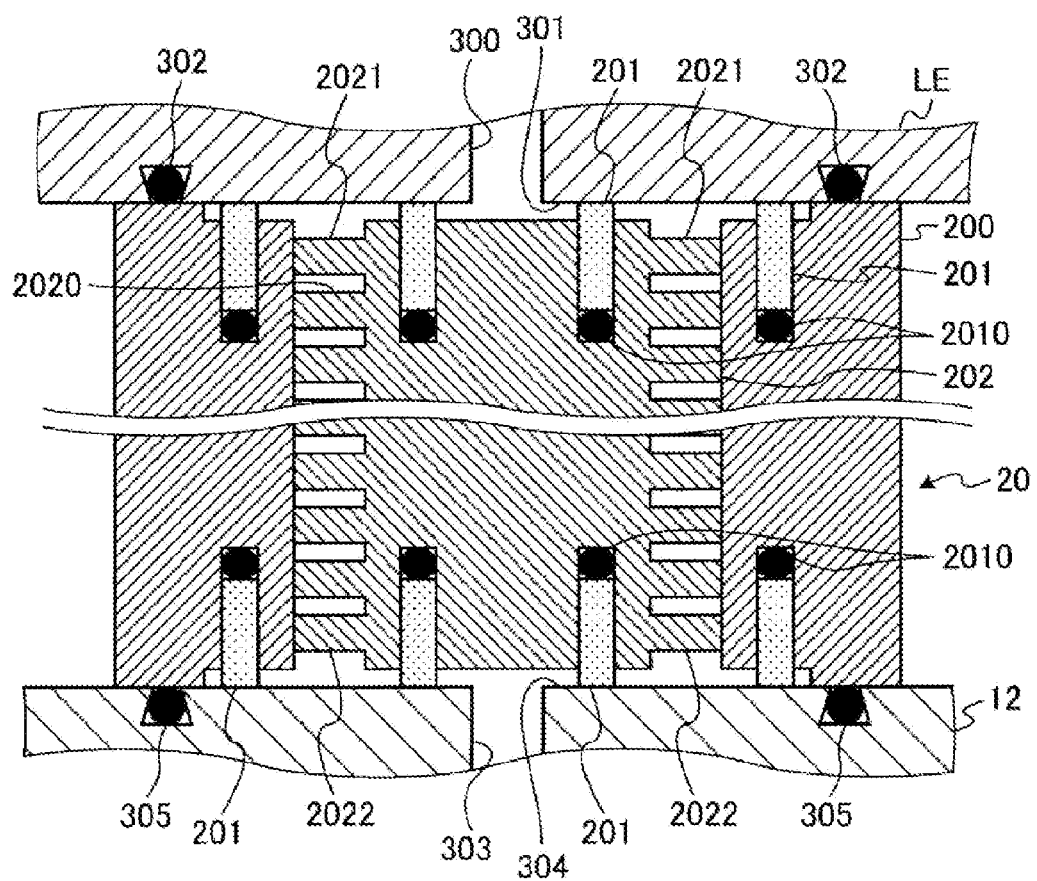
FIG. 12 is a cross-sectional view showing another example of the arrangement of the high dielectric constant member.

In addition, in the above embodiment, each high dielectric constant member 201 is not in contact with the lower electrode LE and the bottom of the processing container 12, but the disclosed technique is not limited thereto. As another configuration, each high dielectric constant member 201 may be in contact with the lower electrode LE or the bottom of the processing container 12, as shown, for example, in FIG. 12. FIG. 12 is a cross-sectional view showing another example of the arrangement of the high dielectric constant member 201. In the example of FIG. 12, each high dielectric constant member 201 is biased by a biasing member 2010 toward the lower electrode LE or toward the bottom of the processing container 12. The biasing member 2010 is an elastic body such as an O-ring, a metal spiral, a spring, or the like. As a result, the magnitude of an electric field between the lower electrode LE and the high dielectric constant member 201 and between the bottom of the processing container 12 and the high dielectric constant member 201 can be reduced, thereby further suppressing the discharge at the connecting portions of the piping assembly 20.

In addition, in the configuration illustrated in FIG. 12, the shape of each high dielectric constant member 201 may be the same as that of the high dielectric constant member 201 illustrated, for example, in FIG. 10 or 11. In addition, when the shape of each high dielectric constant member 201 is a hollow cylinder shape, the high dielectric constant member 201 may not be provided at the end of the core block 202.

Figure 13:
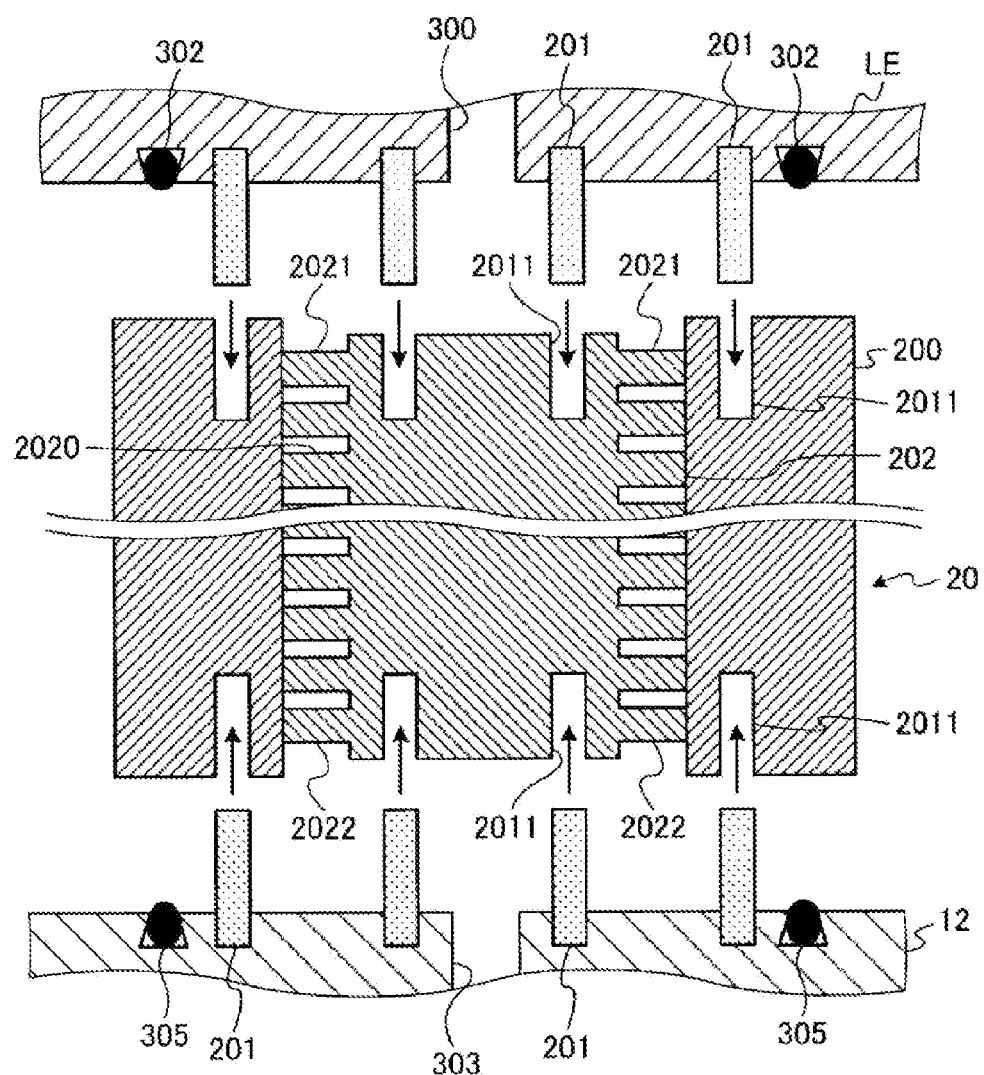
FIG. 13 is a cross-sectional view showing another example of the arrangement of the high dielectric constant member.

In addition, in the above embodiment, each high dielectric constant member 201 is provided at the ends of the hollow tube 200 and the core block 202, but the disclosed technique is not limited thereto. For example, as shown in FIG. 13, a concave portion 2011 having a shape corresponding to the high dielectric constant member 201 may be formed at the ends of the hollow tube 200 and the core block 202, and the high dielectric constant member 201 may be provided at positions of the lower electrode LE and the bottom of the processing container 12, which face the concave portion 2011. FIG. 13 is a cross-sectional view showing another example of the arrangement of the high dielectric constant member 201. Even with such a configuration, it is possible to suppress the occurrence of discharge at the connecting portions of the piping assembly 20.

Further, the concave portion 2011 formed at the ends of the hollow tube 200 and the core block 202 and the high dielectric constant member 201 provided on the lower electrode LE act as a guide to assist alignment when the piping assembly 20 is attached to the lower electrode LE. Similarly, the concave portion 2011 formed at the ends of the hollow tube 200 and the core block 202 and the high dielectric constant member 201 provided at the bottom of the processing container 12 act as a guide to assist alignment when the piping assembly 20 is attached to the bottom of the processing container 12. As a result, the assembly of the apparatus body 10 can be facilitated.

In addition, in FIG. 13, the high dielectric constant member 201 is provided at the ends of the hollow tube 200 and the core block 202, but the disclosed technique is not limited thereto. For example, a concave portion 2011 having a shape corresponding to the high dielectric constant member 201 may be formed at the ends of the hollow tube 200 and the core block 202, and a concave portion having a shape corresponding to the high dielectric constant member 201 may also be formed at positions of the lower electrode LE and the bottom of the processing container 12, which face the concave portion 2011. In this case, for example, after the high dielectric constant member 201 is inserted into the concave portion 2011 at the ends of the hollow tube 200 and the core block 202 or the concave portion at the lower electrode LE and the bottom of the processing container 12, the piping assembly 20 is assembled to the bottom of the processing container 12 and the lower electrode LE.

Figure 14:
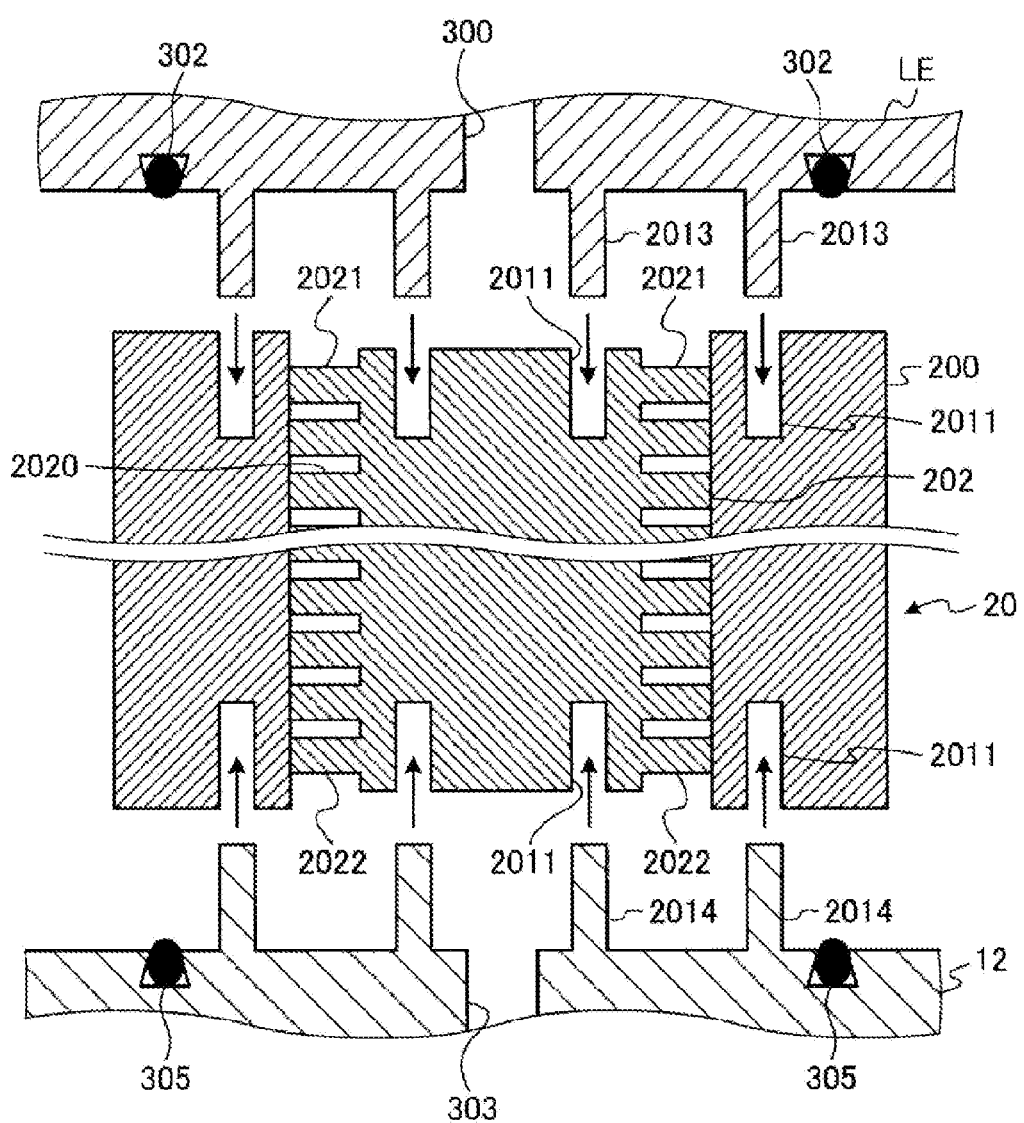
FIG. 14 is a cross-sectional view showing another example of the arrangement of the high dielectric constant member.

Additionally, as shown, for example, in FIG. 14, a convex portion 2013 may be formed on the lower surface of the lower electrode LE at a position facing the concave portion 2011, and the piping assembly 20 may be attached to the lower electrode LE so that the convex portion 2013 is accommodated in the concave portion 2011. Further, as shown, for example, in FIG. 14, a convex portion 2014 may be formed on the upper surface of the bottom of the processing container 12 at a position facing the concave portion 2011, and the piping assembly 20 may be attached to the bottom of the processing container 12 so that the convex portion 2014 is accommodated in the concave portion 2011. FIG. 14 is a cross-sectional view showing another example of the arrangement of the high dielectric constant member. The convex portion 2013 is formed integrally with the lower electrode LE by the same material as the lower electrode LE, and the convex portion 2014 is formed integrally with the processing container 12 by the same material as the processing container 12. In the present embodiment, the lower electrode LE and the processing container 12 are made of, for example, a conductive material such as aluminum, and the hollow tube 200 and the core block 202 are made of, for example, resin. Therefore, the convex portion 2013 and the convex portion 2014 have a higher dielectric constant than the hollow tube 200 and the core block 202. The convex portion 2013 and the convex portion 2014 are examples of the high dielectric constant member.

Further, in the above embodiment, the high dielectric constant member 201 made of the same material is provided at the ends of the hollow tube 200 and the core block 202, but the disclosed technique is not limited thereto. For example, the high dielectric constant member 201 provided at the end of the hollow tube 200 and the high dielectric constant member 201 provided at the end of the core block 202 may be made of different materials.

In addition, in the above embodiment, the capacitively-coupled plasma has been described as an example of the plasma source used in the apparatus body 10, but the plasma source is not limited thereto. Plasma sources other than capacitively-coupled plasma include, for example, inductively-coupled plasma (ICP), microwave excited surface wave plasma (SWP), electron cyclotron resonance plasma (ECP), helicon wave excited plasma (HWP), and the like.

Further, in the above embodiment, as the apparatus body 10, an example of an apparatus that performs etching on the substrate W using plasma has been described, but the disclosed technique is not limited thereto. For example, the disclosed technique can be applied to an apparatus that performs processes such as film formation, modification, or the like using plasma. In addition, the disclosed technique can be applied to an apparatus that does not use plasma but has a pipe that is disposed between two conductive members having a potential difference and flows a gas from one conductive member to the other conductive member.

According to the present disclosure in some embodiments, it is possible to suppress the occurrence of discharge at the connecting portions of the pipe.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a conductive enclosure having a gas passage, the conductive enclosure being grounded;
a substrate support disposed in the conductive enclosure, the substrate support including a conductive member having a gas passage;
a power source connected to the conductive member; and
a piping assembly disposed between the conductive enclosure and the conductive member, the piping assembly being configured to supply a gas from an outside of the conductive enclosure to the gas passage of the conductive member through the gas passage of the conductive enclosure,
the piping assembly including:
a hollow tube having an inner sidewall, the hollow tube being made of a resin;
a core block disposed in the hollow tube, the core block having an outer sidewall fitting the inner sidewall of the hollow tube, the core block being made of a resin;
a first annular dielectric member embedded in the hollow tube, the first annular dielectric member comprising a material selected from the group consisting of quartz, ceramics, silicon, and metals; and
a second annular dielectric member embedded in the core block, the second annular dielectric member comprising a material selected from the group consisting of quartz, ceramics, silicon, and metals,
wherein at least one of the inner sidewall of the hollow tube and the outer sidewall of the core block has at least one spiral groove, the at least one spiral groove defines an internal passage having a first opening and a second opening, the first opening is in fluid communication with the gas passage of the conductive member, and the second opening is in fluid communication with the gas passage of the conductive enclosure, and
wherein dielectric constants of the first annular dielectric member and the second annular dielectric member are higher than those of the hollow tube and the core block.

2. The substrate processing apparatus of claim 1, wherein the hollow tube has a hollow cylinder shape, and the core block has a cylinder shape.

3. The substrate processing apparatus of claim 2, wherein
the first annular dielectric member is embedded in the hollow tube in a vicinity of the first opening, and
the second annular dielectric member is embedded in the core block in a vicinity of the first opening.

4. The substrate processing apparatus of claim 2, further comprising:
a third annular dielectric member embedded in the hollow tube in a vicinity of the second opening, and
a fourth annular dielectric member embedded in the core block in a vicinity of the second opening.

5. The substrate processing apparatus of claim 1, wherein the at least one spiral groove is separated from the first annular dielectric member and the second annular dielectric member by a distance that is within twice the width of the at least one spiral groove.

6. The substrate processing apparatus of claim 1, wherein each of the first annular dielectric member and the second annular dielectric member has a length that is 12 times or more the width of the at least one spiral groove.

7. A piping assembly comprising:
a hollow tube having an inner sidewall, the hollow tube being made of a resin;
a core block disposed in the hollow tube, the core block having an outer sidewall fitting the inner sidewall of the hollow tube, the core block being made of a resin;
a first annular dielectric member embedded in the hollow tube, the first annular dielectric member comprising a material selected from the group consisting of quartz, ceramics, silicon, and metals; and
a second annular dielectric member embedded in the core block, the second annular dielectric member comprising a material selected from the group consisting of quartz, ceramics, silicon, and metals,
wherein at least one of the inner sidewall of the hollow tube and the outer sidewall of the core block has at least one spiral groove, and the at least one spiral groove defines an internal passage having a first opening and a second opening, and
wherein dielectric constants of the first annular dielectric member and the second annular dielectric member are higher than those of the hollow tube and the core block.

* * * * *